US 8,906,271 B2

(12) United States Patent
Lee et al.

(10) Patent No.: US 8,906,271 B2
(45) Date of Patent: Dec. 9, 2014

(54) PHOTOSENSITIVE RESIN COMPOSITION FOR COLOR FILTER AND COLOR FILTER USING THE SAME

(71) Applicants: Yeon-Soo Lee, Uiwang-si (KR);
Seong-Ryong Nam, Uiwang-si (KR);
Taek-Jin Baek, Uiwang-si (KR);
Sang-Won Cho, Uiwang-si (KR);
Jae-Hyun Kim, Uiwang-si (KR);
Chang-Min Lee, Uiwang-si (KR);
Gyu-Seok Han, Uiwang-si (KR)

(72) Inventors: Yeon-Soo Lee, Uiwang-si (KR);
Seong-Ryong Nam, Uiwang-si (KR);
Taek-Jin Baek, Uiwang-si (KR);
Sang-Won Cho, Uiwang-si (KR);
Jae-Hyun Kim, Uiwang-si (KR);
Chang-Min Lee, Uiwang-si (KR);
Gyu-Seok Han, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 102 days.

(21) Appl. No.: 13/652,661

(22) Filed: Oct. 16, 2012

(65) Prior Publication Data
US 2013/0141810 A1    Jun. 6, 2013

(30) Foreign Application Priority Data
Dec. 5, 2011  (KR) .......................... 10-2011-0128781

(51) Int. Cl.
*G02B 5/23*    (2006.01)
*G02B 5/22*    (2006.01)

(52) U.S. Cl.
USPC ........... 252/586; 252/582; 257/432; 359/891; 430/7; 430/270.1; 430/285.1; 430/286.1; 430/434; 552/101

(58) Field of Classification Search
USPC ............ 252/586, 582; 430/5, 7, 270.1, 281.1, 430/286.1, 311, 396, 905, 285.1, 434; 522/18, 74, 184; 257/432; 359/891; 552/101
See application file for complete search history.

(56) References Cited

U.S. PATENT DOCUMENTS

| 5,733,714 | A | 3/1998 | McCulloch et al. |
| 8,212,974 | B2 † | 7/2012 | Ohkuma |
| 8,282,862 | B1 * | 10/2012 | Kim et al. ..................... 252/582 |
| 2003/0229147 | A1 | 12/2003 | Indig |
| 2005/0192379 | A1 | 9/2005 | Kwan |
| 2010/0271578 | A1 † | 10/2010 | Ohkuma |
| 2013/0141810 | A1 | 6/2013 | Lee et al. |

FOREIGN PATENT DOCUMENTS

| CN | 1232552 A | 10/1999 | |
| JP | 2000-095805 A | 4/2000 | |
| JP | 2000-95805 A † | 4/2000 | |
| JP | 2000-095960 * | 4/2000 | .............. C09B 55/00 |
| JP | 2001-124919 A | 5/2001 | |
| JP | 2001-125098 A | 5/2001 | |
| JP | 2004-315594 | 11/2004 | |
| JP | 2009-001770 A | 1/2009 | |
| JP | 2010256598 A † | 11/2010 | |
| JP | 20116886 A † | 4/2011 | |
| JP | 2013-025194 A | 2/2013 | |
| KR | 10-2004-0053964 A | 6/2004 | |
| KR | 10-2005-0042416 A | 5/2005 | |
| KR | 10-2008-0007313 A | 1/2008 | |
| KR | 10-2010-0042173 A | 4/2010 | |
| KR | 10-2010-0045771 A | 5/2010 | |
| KR | 10-2010-0063537 A | 6/2010 | |
| KR | 10-2012-0075950 A | 7/2012 | |
| KR | 10-2013-0053171 A | 5/2013 | |
| WO | 2010123071 A1 † | 10/2010 | |
| WO | 2012/091224 A1 | 7/2012 | |

OTHER PUBLICATIONS

Search Report in counterpart Chinese Application No. 201210382429.2 dated Mar. 6, 2014, pp. 1-2.
English-translation of Search Report in counterpart Chinese Application No. 201210382429.2 dated Mar. 6, 2014, pp. 1-2.
Office Action in commonly owned U.S. Appl. No. 14/067,190 mailed Mar. 28, 2014, pp. 1-24.

* cited by examiner
† cited by third party

*Primary Examiner* — Bijan Ahvazi
(74) *Attorney, Agent, or Firm* — Additon, Higgins & Pendleton, P.A.

(57) ABSTRACT

Disclosed is a photosensitive resin composition for a color filter and a color filter using the same. The photosensitive resin composition for a color filter includes (A) a dye-polymer composite including a structural unit derived from the compound represented by the following Chemical Formula 1, wherein each substituent is the same as defined in the detailed description; (B) an acryl-based photopolymerizable monomer; (C) a photopolymerization initiator; and (D) a solvent.

[Chemical Formula 1]

$$\begin{array}{c} R^1 \diagdown N^+ \diagup R^2 \\ \| \\ X_1 \end{array} \quad V^-$$

$$Y_1 \diagup X_2 \diagdown \diagup X_3 \diagdown Y_2$$

9 Claims, No Drawings

PHOTOSENSITIVE RESIN COMPOSITION FOR COLOR FILTER AND COLOR FILTER USING THE SAME

CROSS-REFERENCE TO RELATED APPLICATION

This application claims priority to and the benefit of Korean Patent Application No. 10-2011-0128781 filed in the Korean Intellectual Property Office on Dec. 5, 2011, the entire disclosure of which is incorporated herein by reference.

FIELD

This disclosure relates to a photosensitive resin composition for a color filter and a color filter using the same.

BACKGROUND

Color filters are used for liquid crystal displays (LCDs), optical filters for cameras, and the like. The color filters may be fabricated by coating a fine region with three or more colors on a charge-coupled device or a transparent substrate. A colored thin film can be fabricated by various methods, such as dyeing, printing, electrophoretic deposition (EPD), pigment dispersion, inkjet printing, and the like.

The color filter is subject to many chemical treatments during the manufacturing process. Accordingly, in order to maintain a pattern formed under the aforementioned condition, a color photosensitive resin is required to have a development margin but chemical resistance, thus to improve yield of a color filter.

Since a color filter of a liquid crystal display device is formed on a TFT array panel using a color filter-on-array (COA) method, a process of forming a transparent electrode on a color filter is needed. The transparent electrode may be fabricated by sequentially forming a transparent conductive layer and a photosensitive resin layer on a color filter, exposing and developing and patterning the photosensitive resin layer, and etching the transparent conductive layer with the use of the patterned photosensitive resin layer. The color filter is required to have chemical resistance because the color filter may be exposed to diverse liquid chemicals, such as a stripping solution for developing the photosensitive resin layer.

Also, the color filter is required to have heat resistance because a plurality of heat treatments is required to form the color filter.

SUMMARY OF THE INVENTION

One embodiment provides a photosensitive resin composition that can have improved heat resistance and chemical resistance.

Another embodiment provides a color filter using the photosensitive resin composition for a color filter.

According to one embodiment, provided is a photosensitive resin composition for a color filter that includes (A) a dye-polymer composite including a structural unit derived from the compound represented by the following Chemical Formula 1; (B) an acrylic-based photopolymerizable monomer; (C) a photopolymerization initiator; and (D) a solvent.

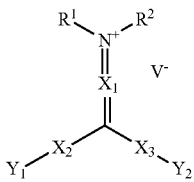

[Chemical Formula 1]

In Chemical Formula 1, $X_1$ is substituted or unsubstituted C3 to C30 cycloalkenyl, substituted or unsubstituted C3 to C30 heterocycloalkenyl, or a combination thereof, $X_2$ and $X_3$ are the same or different and are each independently substituted or unsubstituted C6 to C30 arylene, substituted or unsubstituted C6 to C30 alkylarylene, substituted or unsubstituted C3 to C30 heteroarylene, or a combination thereof, $Y_1$ and $Y_2$ are the same or different and are each independently —$NR^3R^4$, —$OR^5$, or —$SR^6$, $V^-$ is a counter ion of $N^+$, and $R^1$ to $R^6$ are the same or different and are each independently hydrogen, substituted or unsubstituted C1 to C30 alkyl, substituted or unsubstituted C6 to C30 aryl, substituted or unsubstituted C6 to C30 alkylaryl, substituted or unsubstituted C3 to C30 heteroaryl, substituted or unsubstituted (meth)acrylate, or a combination thereof, provided that at least one of $R^1$ to $R^6$ is substituted or unsubstituted C2 to C30 alkenyl.

At least one of $R^1$ to $R^6$ may include the following Chemical Formula 2.

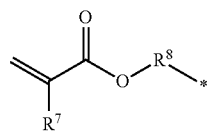

[Chemical Formula 2]

In Chemical Formula 2, $R^7$ is hydrogen, substituted or unsubstituted C1 to C30 alkyl, substituted or unsubstituted C6 to C30 aryl, substituted or unsubstituted C6 to C30 alkylaryl, or substituted or unsubstituted C3 to C30 heteroaryl, $R^8$ is a single bond, substituted or unsubstituted C1 to C30 alkylene, substituted or unsubstituted C6 to C30 arylene, substituted or unsubstituted C6 to C30 alkylarylene, substituted or unsubstituted C3 to C30 heteroarylene,

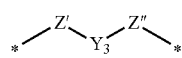

wherein Z' and Z" are the same or different are each independently C1 to C30 alkylene and $Y_3$ is —N(H)—, —S—, or —O—, or a combination thereof.

The compound represented by Chemical Formula 1 may be represented by the following Chemical Formula 3.

[Chemical Formula 3]

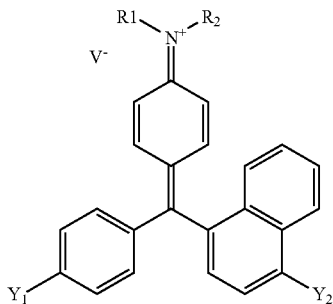

In Chemical Formula 3, $Y_1$ and $Y_2$ are the same or different and are each independently $-NR^3R^4$, $-OR^5$, or $-SR^6$, $V^-$ is a counter ion of $N^+$, and $R^1$ to $R^6$ are the same or different and are each independently hydrogen, substituted or unsubstituted C1 to C30 alkyl, substituted or unsubstituted C6 to C30 aryl, substituted or unsubstituted C6 to C30 alkylaryl, substituted or unsubstituted C3 to C30 heteroaryl, substituted or unsubstituted (meth)acrylate, or combination thereof, provided that at least one of $R^1$ to $R^6$ is substituted or unsubstituted C2 to C30 alkenyl.

The compound represented by Chemical Formula 1 may be represented by the following Chemical Formula 4.

[Chemical Formula 4]

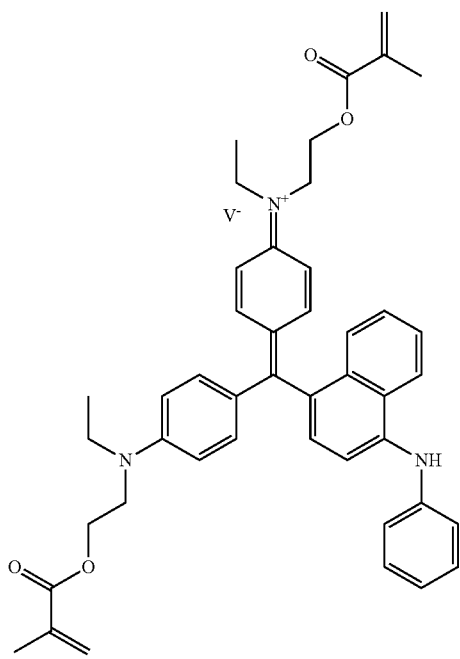

In Chemical Formula 4, $V^-$ is a counter ion of $N^+$.

The dye-polymer composite (A) may include a structural unit derived from the compound represented by Chemical Formula 1 in an amount of about 0.1 wt % to about 50 wt % based on the total amount (weight) of the dye-polymer composite (A).

The photosensitive resin composition for a color filter may include (A) about 0.5 wt % to about 40 wt % of the dye-polymer composite; (B) about 0.5 wt % to about 20 wt % of the acrylic-based photopolymerizable monomer; (C) about 0.1 wt % to about 10 wt % of the photopolymerization initiator; and (D) balance of the solvent.

The dye-polymer composite (A) may have a weight average molecular weight (Mw) of about 1,000 to about 500,000.

The dye-polymer composite (A) may include at least one of the structural units represented by the following Chemical Formulae 5 to 7 or a combination thereof.

[Chemical Formula 5]

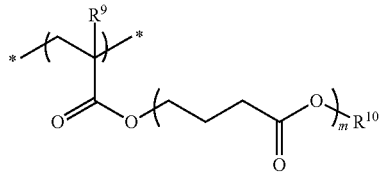

[Chemical Formula 6]

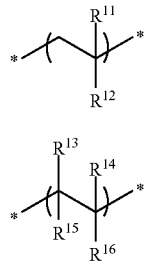

[Chemical Formula 7]

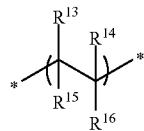

In Chemical Formulae 5 to 7, $R^9$, $R^{10}$, $R^{11}$, $R^{13}$, and $R^{14}$ are the same or different and are independently hydrogen, substituted or unsubstituted C1 to C30 alkyl, substituted or unsubstituted C6 to C30 aryl, substituted or unsubstituted C6 to C30 alkylaryl, or a combination thereof, $R^{12}$ is substituted or unsubstituted C1 to C30 alkyl, substituted or unsubstituted C6 to C30 aryl or $-CO-R^{17}-COOH$, wherein $R^{17}$ is substituted or unsubstituted C1 to C30 alkylene or substituted or unsubstituted C1 to C30 alkoxylene, or a combination thereof, $R^{15}$ is $-COOH$ or $-CONHR^{18}$, wherein $R^{18}$ is substituted or unsubstituted C1 to C30 alkyl or substituted or unsubstituted C6 to C30 aryl, $R^{16}$ is $-COOH$, or $R^{15}$ and $R^{16}$ are fused to form a ring, and m is an integer of 0 to 5.

The dye-polymer composite (A) includes the structural units represented by the above Chemical Formulae 5 to 7 in the amounts of o, p and q mol based on the total amount of the dye-polymer composite (A), where the o, p, and q are about $0 \leq o \leq 80$, and $0 \leq q \leq 80$, respectively.

The dye-polymer composite (A) may include structural units represented by Chemical Formulae 5 to 7 in an amount of about 0.1 wt % to about 50 wt % based on the total amount (weight) of the dye-polymer composite (A).

The photosensitive resin composition for a color filter may further include a pigment, a dye or a combination thereof, which may be present in an amount of about 0.1 wt % to about 40 wt %, based on the total weight of the photosensitive resin composition.

According to another embodiment, a color filter manufactured using the photosensitive resin composition for a color filter.

According to yet another embodiment, an electronic device including the color filter is provided.

The photosensitive resin composition for a color filter can have excellent heat resistance and chemical resistance and can provide a color filter having high contrast ratio and luminescence characteristics.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a definition is not otherwise provided, the term "alkyl" may refer to C1 to C30 alkyl, the term "alkenyl" may refer to C2 to C30 alkenyl, the term "cycloalkyl" may refer to C3 to C30 cycloalkyl, the term "heterocycloalkyl" may refer to C2 to C30 heterocycloalkyl, the term "aryl" may refer to C6 to C30 aryl, the term "arylalkyl" may refer to C7 to C30 arylalkyl, the term "heteroaryl" may refer to C3 to 30 heteroaryl, the term "alkylene" may refer to C1 to C20 alkylene, the term "arylene" may refer to C6 to C30 arylene, the term "alkylarylene" may refer to C6 to C30 alkylarylene, the term "heteroarylene" may refer to a C3 to C30 heteroarylene, and the term "alkoxylene" may refer to C1 to C30 alkoxylene.

As used herein, when a specific definition is not otherwise provided, the term "substituted" refers to one substituted with halogen (F, Cl, Br, or I), a hydroxy group, a nitro group, a cyano group, an imino group (=NH, =NR, wherein R is C1 to 10 alkyl), an amino group (—NH$_2$, —NH(R'), —N(R")(R'")), wherein R' to R'" are the same or different and are each independently C1 to 10 alkyl), an amidino group, a hydrazine or hydrazone group, a carboxyl group, substituted or unsubstituted C1 to C30 alkyl, a substituted or unsubstituted C6 to C30 aryl, substituted or unsubstituted C3 to C30 cycloalkyl, substituted or unsubstituted C3 to C30 heteroaryl, substituted or unsubstituted C2 to C30 heterocycloalkyl, or a combination thereof, instead of at least one hydrogen of a functional group.

As used herein, when a definition is not otherwise provided, the term "hetero" may refer to one including an atom of N, O, S, P or a combination thereof, instead of a carbon atom.

As used herein, "*" denotes a position linked to the same or different atom or chemical formula.

The photosensitive resin composition for a color filter according to one embodiment includes (A) a dye-polymer composite; (B) an acrylic-based photopolymerizable monomer; (C) a photopolymerization initiator; and (D) a solvent.

Hereinafter, each component of the photosensitive resin composition according to one embodiment is described in detail.

(A) Dye-Polymer Composite

The dye-polymer composite of the photosensitive resin composition for a color filter includes a structural unit derived from the compound represented by the following Chemical Formula 1.

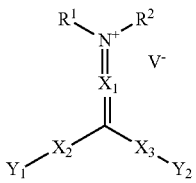

[Chemical Formula 1]

In Chemical Formula 1, $X_1$ is substituted or unsubstituted C3 to C30 cycloalkenyl, substituted or unsubstituted C3 to C30 heterocycloalkenyl, or a combination thereof, $X_2$ and $X_3$ are the same or different and are each independently substituted or unsubstituted C6 to C30 arylene, substituted or unsubstituted C6 to C30 alkylarylene, substituted or unsubstituted C3 to C30 heteroarylene, or a combination thereof, $Y_1$ and $Y_2$ are the same or different and are each independently —NR$^3$R$^4$, —OR$^5$, or —SR$^6$, $V^-$ is a counter ion of N$^+$, and $R^1$ to $R^6$ are the same or different and are each independently hydrogen, substituted or unsubstituted C1 to C30 alkyl, substituted or unsubstituted C6 to C30 aryl, substituted or unsubstituted C6 to C30 alkylaryl, substituted or unsubstituted C3 to C30 heteroaryl, substituted or unsubstituted (meth)acrylate, or a combination thereof, provided that at least one of $R^1$ to $R^6$ is substituted or unsubstituted C2 to C30 alkenyl.

At least one of $R^1$ to $R^6$ in the above Chemical Formula 1 may include substituted or unsubstituted C2 to C30 alkenyl, and the alkenyl group undergoes a polymerization reaction to prepare the dye-polymer composite (A) including the structural unit derived from the compound represented by Chemical Formula 1.

$V^-$ is a counter ion of N$^+$, for example monovalent negative ion N$^-$(SO$_2$CF$_3$)$_2$, and the like.

In one embodiment, the substituted or unsubstituted C2 to C30 alkenyl group as at least one of $R^1$ to $R^6$ of Chemical Formula 1 may be represented by the following Chemical Formula 2.

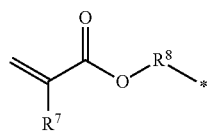

[Chemical Formula 2]

In Chemical Formula 2, $R^7$ is hydrogen, substituted or unsubstituted C1 to C30 alkyl, substituted or unsubstituted C6 to C30 aryl, substituted or unsubstituted C6 to C30 alkylaryl, substituted or unsubstituted C3 to C30 heteroaryl, or a combination thereof, $R^8$ is a single bond, substituted or unsubstituted C1 to C30 alkylene, substituted or unsubstituted C6 to C30 arylene, substituted or unsubstituted C6 to C30 alkylarylene, substituted or unsubstituted C3 to C30 heteroarylene,

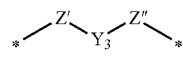

wherein Z' and Z" are the same or different and are each independently C1 to C30 alkyl and $Y_3$ is —N(H)—, —S—, or —O—, or a combination thereof.

The compound represented by Chemical Formula 1 may be represented by the following Chemical Formula 3.

[Chemical Formula 3]

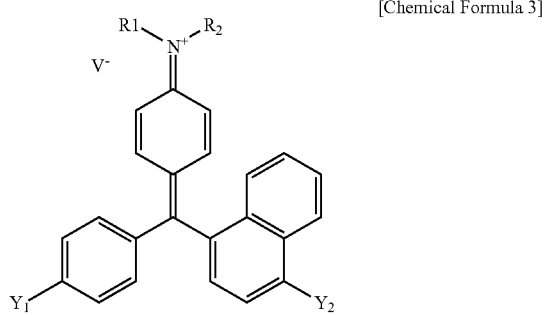

In Chemical Formula 3, $Y_1$, $Y_2$, $R^1$, $R^2$, and $V^-$ are the same as described above.

The compound represented by Chemical Formula 3 may be represented by the following Chemical Formula 4.

[Chemical Formula 4]

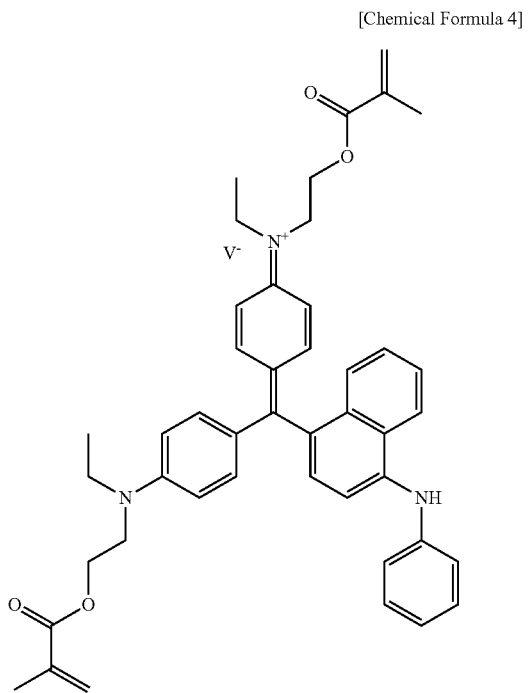

The dye-polymer composite (A) may be obtained by copolymerizing the compound represented by Chemical Formula 1 with another copolymerizable monomer.

As described above, since the dye-polymer composite (A) may have a high molecular weight due to the copolymerization reaction between a dye, e.g., the compound represented by the Chemical Formula 1 and another copolymerizable monomer, a low-molecular dye may not be extracted with water or an organic solvent and it can have high heat resistance and chemical resistance in the process of manufacturing a color filter.

The photosensitive resin composition may include the dye-polymer composite (A) in an amount of about 0.5 wt % to about 40 wt %, for example, about 1 wt % to about 30 wt %, based on the total amount (weight) of the photosensitive resin composition for a color filter. In some embodiments, the photosensitive resin composition may include the dye-polymer composite (A) in an amount of about 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the dye-polymer composite (A) can be in a range from about any of the foregoing amounts to about any other of the foregoing amounts.

When the amount of the dye-polymer composite (A) falls within the above range, the developability in an alkali developing solution and cross-linking property can be excellent so as to decrease surface roughness, and the chemical resistance can be good so that pattern is not pulled out, and the color is not changed even in an organic solvent.

The dye-polymer composite (A) may further include a structural unit derived from a first ethylenic unsaturated monomer and a structural unit derived from a second ethylenic unsaturated monomer copolymerizable with the first ethylenic unsaturated monomer, along with the structural unit derived from the compound represented by the following Chemical Formula 1.

The first ethylenic unsaturated monomer is an ethylenic unsaturated monomer including at least one carboxyl group. Examples of the first ethylenic unsaturated monomer include without limitation acrylic acid, methacrylic acid, maleic acid, itaconic acid, fumaric acid, and the like, and combinations thereof.

According to one embodiment, the first ethylenic unsaturated monomer may be present in an amount from about 1 wt % to about 50 wt %, for example about 3 wt % to about 40 wt %, and as another example about 5 wt % to 30 wt %, based on the total weight of the monomer(s) that form the dye-polymer composite. In some embodiments, the first ethylenic unsaturated monomer may be present in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the first ethylenic unsaturated monomer can be in a range from about any of the foregoing amounts to about any other of the foregoing amounts.

Examples of the second ethylenic unsaturated monomer may include without limitation alkenyl aromatic monomers, unsaturated carbonic acid ester compounds, unsaturated carbonic acid amino alkyl ester compounds, carbonic acid vinyl ester compounds, unsaturated carbonic acid glycidyl ester compounds, vinyl cyanide compounds, unsaturated amide compounds, and the like, and combinations thereof.

Examples of the alkenyl aromatic monomer may include without limitation styrene, α-methyl styrene, vinyl toluene, vinyl benzyl methylether, and the like; examples of the unsaturated carbonic acid ester compound may include without limitation methyl acrylate, methyl methacrylate, ethyl acrylate, ethyl methacrylate, butyl acrylate, butyl methacrylate, 2-hydroxy ethyl acrylate, 2-hydroxy ethyl methacrylate, 2-hydroxy butyl acrylate, 2-hydroxy butyl methacrylate, benzyl acrylate, benzyl methacrylate, cyclohexyl acrylate, cyclohexyl methacrylate, phenyl acrylate, phenyl methacrylate, and the like; examples of the unsaturated carbonic acid amino alkyl ester compound may include without limitation 2-amino ethyl acrylate, 2-amino ethyl methacrylate, 2-dimethyl amino ethyl acrylate, 2-dimethyl amino ethyl methacrylate, and the like; examples of the carbonic acid vinyl ester compound may include without limitation vinyl acetate, vinyl benzoate, and the like; examples of the unsaturated carbonic acid glycidyl ester compound may include without limitation glycidyl acrylate, glycidyl methacrylate, and the like; examples of the vinyl cyanide compound may include without limitation acrylonitrile, methacrylonitrile, and the like; examples of the unsaturated amide compound may include without limitation acrylamide, methacrylamide, and the like. Such an unsaturated the second ethylenic unsaturated monomer may be used singularly or as a mixture of two or more.

The dye-polymer composite (A) may include at least one of the structural units represented by the following Chemical Formulae 5 to 7, or a combination thereof, along with the structural unit derived from the compound represented by the following Chemical Formula 1.

[Chemical Formula 5]

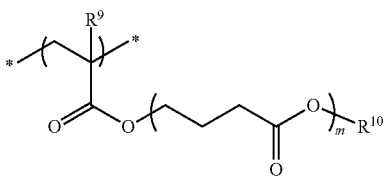

[Chemical Formula 6]

[Chemical Formula 7]

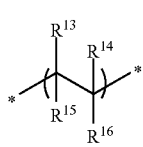

In Chemical Formulae 5 to 7, $R^9$, $R^{10}$, $R^{11}$, $R^{13}$, and $R^{14}$ are the same or different and are independently hydrogen, substituted or unsubstituted C1 to C30 alkyl, substituted or unsubstituted C6 to C30 aryl, substituted or unsubstituted C6 to C30 alkylaryl, or a combination thereof, $R^{12}$ is substituted or unsubstituted C1 to C30 alkyl, substituted or unsubstituted C6 to C30 aryl, —CO—$R^{17}$—COOH wherein $R^{17}$ is substituted or unsubstituted C1 to C30 alkylene or substituted or unsubstituted C1 to C30 alkoxylene group, or a combination thereof, $R^{15}$ is —COOH or —CONHR$^{18}$ wherein $R^{18}$ is substituted or unsubstituted C1 to C30 alkyl group or substituted or unsubstituted C6 to C30 aryl, $R^{16}$ is —COOH, or $R^{15}$ and $R^{16}$ are fused to form a ring, and m is an integer of 0 to 5.

The dye-polymer composite (A) may include all the structural units represented by the above Chemical Formulae 5 to 7, and when the structural units are included in the amounts of o, p, and q, respectively, the o, p, and q may be about 0≤o≤80, 0≤p≤80 and 0≤q≤80 according to one embodiment, and the o, p, and q may be about 0≤o≤50, 0≤p≤50, and 0≤q≤50 according to another embodiment.

In some embodiments, the structural units represented by Chemical Formula 5 may be present in an amount of zero mol % (the structural unit represented by Chemical Formula 5 is not present), about 0 (the structural unit represented by Chemical Formula 5 is present), 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80 mol %. Further, according to some embodiments of the present invention, the amount of the structural units represented by Chemical Formula 5 can be in a range from about any of the foregoing amounts to about any other of the foregoing amounts.

In some embodiments, the structural units represented by Chemical Formula 6 may be present in an amount of zero mol % (the structural unit represented by Chemical Formula 6 is not present), about 0 (the structural unit represented by Chemical Formula 6 is present), 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80 mol %. Further, according to some embodiments of the present invention, the amount of the structural units represented by Chemical Formula 6 can be in a range from about any of the foregoing amounts to about any other of the foregoing amounts.

In some embodiments, the structural units represented by Chemical Formula 7 may be present in an amount of zero mol % (the structural unit represented by Chemical Formula 7 is not present), about 0 (the structural unit represented by Chemical Formula 7 is present), 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80 mol %. Further, according to some embodiments of the present invention, the amount of the structural units represented by Chemical Formula 7 can be in a range from about any of the foregoing amounts to about any other of the foregoing amounts.

When the dye-polymer composite (A) includes structural units represented by the above Chemical Formulae 5 to 7 in the above mole ratio ranges, it can be possible to secure appropriate levels of developability, heat resistance, and chemical resistance.

The structural units represented by Chemical Formulae 5 to 7 may be present in an amount of about 0.1 wt % to about 50 wt %, for example about 30 wt % to about 40 wt % based on the total amount of the dye-polymer composite (A). In some embodiments, the dye-polymer composite (A) may include the structural units represented by Chemical Formulae 5 to 7 in an amount of 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the structural units represented by Chemical Formulae 5 to 7 can be in a range from about any of the foregoing amounts to about any other of the foregoing amounts.

When a color filter is manufactured and the structural units selected from the group consisting of the above Chemical Formulae 5 to 7 are included in amounts within the above range, chemical resistance and chemical resistance can be greatly improved and the pattern can be stable while light transmittance characteristics may not be deteriorated.

The dye-polymer composite (A) may have a weight average molecular weight (Mw) of about 1,000 to about 500,000, for example about 5,000 to about 10,000, and as another example about 7,000 to about 8,000. When the dye-polymer composite (A) has a too great weight average molecular weight (Mw), it can be difficult to be synthesized and the compound about Chemical Formula 1 may be precipitated.

The dye-polymer composite (A) may have an acid value of about 0 to about 300 mg KOH/g, for example about 10 to about 200 mg KOH/g. Whe the weight average molecular weight and acid value of the dye-polymer composite (A) falls within the above ranges, excellent developability may be obtained.

Also, the amount of the structural unit derived from the compound represented by Chemical Formula 1 included in the dye-polymer composite (A) may be controlled to an appropriate level according to the purpose. The dye-polymer composite (A) may include the structural unit derived from the compound represented by Chemical Formula 1 in an amount of about 0.1 wt % to 50 wt %, for example, about 1 wt % to about 40 wt % based on the total amount (weight) of the dye-polymer composite (A). In some embodiments, the dye-polymer composite (A) may include the structural unit derived from the compound represented by Chemical Formula 1 in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the structural unit derived from the compound represented by Chemical Formula 1 can be in a range from about any of the foregoing amounts to about any other of the foregoing amounts.

When the amount of the structural unit derived from the compound represented by Chemical Formula 1 falls within the above range, excellent chemical resistance and heat resistance may be obtained with minimal or no precipitation of the dye due to an excessive amount of the dye.

The extent of photocross-linking (cross-linking extent) caused by the dye-polymer composite (A) may be decided based on the composition ratio of an acrylic-based photopolymerizable monomer and a photopolymerization initiator, which is described below, and accordingly the cross-linking extent may be controlled by adjusting the composition ratio of the acrylic-based photopolymerizable monomer and the photopolymerization initiator.

(B) Acrylic-Based Photopolymerizable Monomer

The photopolymerizable monomer may be a photopolymerizable monomer that may be included in a photosensitive resin composition.

Examples of the photopolymerizable monomer may include without limitation ethylene glycol di(meth)acrylate, diethylene glycol di(meth)acrylate, triethylene glycol di(meth)acrylate, propylene glycol di(meth)acrylate, 1,4-butanediol di(meth)acrylate, 1,6-hexanediol di(meth)acrylate, neopentylglycol di(meth)acrylate, pentaerythritol di(meth)acrylate, pentaerythritol tri(meth)acrylate, pentaerythritol tetra(meth)acrylate, pentaerythritol penta(meth)acrylate, pentaerythritol hexa(meth)acrylate, dipentaerythritol di(meth)acrylate, dipentaerythritol tri(meth)acrylate, dipentaerythritol tetra(meth)acrylate, dipentaerythritol penta(meth)acrylate, dipentaerythritol hexa(meth)acrylate, bisphenol A di(meth)acrylate, trimethylolpropane tri(meth)acrylate, novolacepoxy (meth)acrylate, a dipentaerythritol penta(meth)acrylate derivative including a carboxyl group, ethyleneoxide glycerinetrimethylolpropanetri(meth)acrylate, propyleneoxide glycerinetri(meth)acrylate, and the like, and combinations thereof.

The photopolymerizable monomer may be a monomer including a carboxyl group, since such monomers tend to react with a cyclic ether and thereby improve solvent-resistance. The photopolymerizable monomer including a carboxyl group may include an ester of a hydroxyl group-containing (meth)acrylate and carboxylic polyacid, an ester of a hydroxyl group-containing (meth)acrylate and carboxylic polyacid anhydride, and the like, and combinations thereof.

Examples of the hydroxyl group-containing (meth)acrylate can include without limitation trimethylolpropane di(meth)acrylate, glycerine di(meth)acrylate, pentaerythritol tri(meth)acrylate, dipentaerythritol penta(meth)acrylate, and the like, and combinations thereof.

Examples of the carboxylic polyacid can include without limitation aromatic carboxylic polyacids such as phthalic acid, 3,4-dimethylphthalic acid, isophthalic acid, terephthalic acid, pyromellitic acid, trimellitic acid, 1,4,5,8-naphthalenetetracarboxylic acid, 3,3',4,4'-benzophenonetetracarboxylic acid, and the like; aliphatic carboxylic polyacids such as succinic acid, glutaric acid, sebacic acid, 1,2,3,4-butanetetracarboxylic acid, maleic acid, fumaric acid, itaconic acid, and the like; alicyclic carboxylic polyacids such as hexahydrophthalic acid, 3,4-dimethyltetrahydrophthalic acid, hexahydroisophthalic acid, hexahydroterephthalic acid, 1,2,4-cyclopentanetricarboxylic acid, 1,2,4-cyclohexanetricarboxylic acid, cyclopentanetetracarboxylic acid, 1,2,4,5-cyclohexane, tetracarboxylic acid, and the like; and the like, and combinations thereof.

Examples of the carboxylic polyacid anhydride may include without limitation aromatic carboxylic polyacid anhydrides such as phthalic anhydride, pyromellitic anhydride, trimellitic anhydride, 3,3',4,4'-benzophenone tetracarboxylic acid 2 anhydride, and the like; aliphatic carboxylic polyacid anhydrides such as itaconic anhydride, succinic anhydride, citraconic anhydride, dodecenylsuccinic anhydride, tricarbalyl anhydride, maleic anhydride, 1,2,3,4-butanetetracarboxylic acid 2 anhydride, and the like; alicyclic carboxylic polyacid anhydrides such as hexahydrophthalic acid, 3,4-dimethyl tetrahydrophthalic anhydride, 1,2,4-cyclopentane tricarboxylic acid anhydride, 1,2,4-cyclohexane tricarboxylic acid anhydride, cyclopentane tetracarboxylic acid 2 anhydride, 1,2,4,5-cyclohexane tetracarboxylic acid 2 anhydride, himic anhydride, nadic acid anhydride, and the like; carboxylic acid anhydrides including an ester group such as ethylene glycol bistrimellitate acid, glycerine tristrimelliatate anhydride, and the like; and the like, and combinations thereof.

Examples of the monomer including a carboxyl group may include without limitation a phthalic acid ester of trimethylol propane di(meth)acrylate, a succinic acid ester of glycerine di(meth)acrylate, a phthalic acid ester of pentaerythritol tri (meth)acrylate, a succinic acid ester of pentaerythritol triacrylate, a phthalic acid ester of dipentaerythritol penta(meth)acrylate, a succinic acid ester of dipentaerythritol penta (meth)acrylate, and the like, and combinations thereof.

The photosensitive resin composition may include the acrylic-based photopolymerizable monomer in an amount of about 0.5 wt % to 20 wt % based on the total amount (weight) of the photosensitive resin composition for a color filter. In some embodiments, the photosensitive resin composition may include the acrylic-based photopolymerizable monomer in an amount of about 0.5, 0.6, 0.7, 0.8, 0.9, 1, 2, 3, 4, 5, 6, 7, 8, 9, 10, 11, 12, 13, 14, 15, 16, 17, 18, 19, or 20 wt %. Further, according to some embodiments of the present invention, the amount of acrylic-based photopolymerizable monomer can be in a range from about any of the foregoing amounts to about any other of the foregoing amounts.

When the amount of the acrylic-based photopolymerizable monomer falls in the above range, a pattern can be formed with clear edges and developability in an alkali developing solution can be excellent.

(C) Photopolymerization Initiator

Examples of the photopolymerization initiator may include without limitation triazine-based compounds, acetophenone-based compounds, biimidazole-based compounds, benzoin-based compounds, benzophenone-based compounds, thioxanthone-based compounds, oxime-based compounds, and the like, and combinations thereof.

Examples of the triazine-based compound may include without limitation 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl)ethenyl]-1,3,5-triazine, 2,4-bis(trichloromethyl)-6-[2-(3,4-dimethoxyphenyl)ethenyl]-1,3,5-triazine, 2,4-bis(trichloromethyl)-6-piperonyl-1,3,5-triazine, 2,4,6-trichloro-s-triazine, 2-phenyl-4,6-bis(trichloro methyl)-s-triazine, 2-(3',4'-dimethoxy styryl)-4,6-bis(trichloro methyl)-s-triazine, 2-(4'-methoxy naphthyl)-4,6-bis(trichloro methyl)-s-triazine, 2-(p-methoxy phenyl)-4,6-bis(trichloro methyl)-s-triazine, 2-(p-tolyl)-4,6-bis(trichloro methyl)-s-triazine, 2-biphenyl-4,6-bis(trichloro methyl)-s-triazine, bis(trichloro methyl)-6-styryl-s-triazine, 2-(naphto 1-yl)-4,6-bis(trichloro methyl)-s-triazine, 2-(4-methoxy naphto 1-yl)-4,6-bis(trichloro methyl)-s-triazine, 2-4-trichloro methyl (piperonyl)-6-triazine, 2-4-trichloro methyl (4'-methoxy styryl)-6-triazine, and the like, and combinations thereof. In exemplary embodiments, 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine or 2,4-bis(trichloromethyl)-6-piperonyl-1,3,5-triazine may be used, for example, 2,4-bis(trichloromethyl)-6-piperonyl-1,3,5-triazine may be used.

Examples of the acetophenone-based compound may include without limitation diethoxyacetophenone, 2-methyl-2-morpholino-1-(4-methylthiophenyl)propan-1-one, 2-hydroxy-2-methyl-1-phenylpropan-1-one, benzyldimethylketal, 2-hydroxy-2-methyl-1-[4-(2-hydroxyethoxy)phenyl]propan-1-one, 1-hydroxycyclohexyl phenylketone, 2-benzyl-2-dimethylamino-1-(4-morpholinophenyl)butan-1-one, 2-(4-methylbenzyl)-2-dimethylamino-1-(4-morpholinophenyl)butan-1-one, 2-hydroxy-2-methyl-1-[4-(1-methylvinyl)phenyl]propan-1-one, and the like, and combinations thereof. In exemplary embodiments, 2-methyl-2-morpholino-1-(4-methylthiophenyl)propan-1-one, 2-benzyl-2-dimethylamino-1-(4-morpholinophenyl)butan-1-one or 2-(4-methylbenzyl)-2-dimethyl amino-1-(4-morpholinophenyl)butan-1-one, for example, 2-benzyl-2-dimethylamino-1-(4-morpholinophenyl)butan-1-one, or 2-(4-methylbenzyl)-2-dimethylamino-1-(4-morpholinophenyl)butan-1-one, may be used.

Examples of the biimidazole-based compound may include without limitation 2,2'-bis(2-chlorophenyl)-4,4',5,5'-tetraphenylbiimidazole, 2,2'-bis(2-chlorophenyl)-4,4',5,5'-tetra(4-carboethoxyphenyl)biimidazole, 2,2',-bis(2-chlorophenyl)-4,4',5,5'-tetra(4-bromophenyl)biimidazole, 2,2'-bis(2-chlorophenyl)-4,4',5,5'-tetra(2,4-dichlorophenyl) biimidazole, 2,2'-bis(2-bromophenyl)-4,4',5,5'-tetraphenylbiimidazole, 2,2'-bis(2,4-dichlorophenyl)-4,4',5, 5'-tetraphenylbiimidazole, 2,2'-bis (2-chlorophenyl)-4,4',5, 5'-tetra(m-methoxyphenyl)biimidazole, 2,2'-bis(2,3-dichlorophenyl)-4,4',5,5'-tetraphenylbiimidazole, 2,2'-bis(2,6-dichlorophenyl)-4,4',5,5'-tetraphenylbiimidazole, 2,2'-bis(2-nitrophenyl)-4,4',5,5'-tetraphenylbiimidazole, 2,2'-bis(2-methylphenyl)-4,4',5,5'-tetraphenylbiimidazole, and the like, and combinations thereof. In exemplary embodiments, 2,2'-bis(2-chlorophenyl)-4,4',5,5'-tetraphenylbiimidazole or 2,2'-bis(2,3-dichlorophenyl)-4,4',5,5'-tetraphenylbiimidazole may be used.

Examples of the benzoin-based compound may include without limitation benzoin, benzoin methylether, benzoin ethylether, benzoin isopropylether, benzoin isobutylether, benzyldimethylketal, and the like, and combinations thereof.

Examples of the benzophenone-based compound may include without limitation benzophenone, benzoyl benzoate, o-benzoyl methyl benzoate, 4-phenyl benzophenone, hydroxy benzophenone, acrylated benzophenone, 3,3'-dimethyl-2-methoxy benzophenone, 4,4'-dichloro benzophenone, 4,4'-bis(dimethylamino)benzophenone, 4,4'-bis(diethylamino)benzophenone, 4-benzoyl-4'-methyldiphenylsulfide, 3,3',4,4'-tetra(tert-butylperoxycarbonyl)benzophenone, 2,4,6-trimethylbenzophenone, and the like, and combinations thereof.

Examples of the thioxanthone-based compound may include without limitation thioxanthone, 2-methyl thioxanthone, 2-isopropyl thioxanthone, 4-isopropyl thioxanthone, 2,4-diethyl thioxanthone, 2,4-diisopropyl thioxanthone, 2-chloro thioxanthone, 1-chloro-4-propoxythioxanone, and the like, and combinations thereof.

Examples of the oxime-based compound may include without limitation o-acyloxime-based compounds, 2-(o-benzoyloxime)-1-[4-(phenylthio)phenyl]-1,2-octadione, 1-(o-acetyloxime)-1-[9-ethyl-6-(2-methyl benzoyl)-9H-carbazol-3-yl]ethanone, o-ethoxycarbonyl-α-oxyamino-1-phenylpropan-1-one, and the like, and combinations thereof. Examples of the o-acyloxime-based compound include without limitation 1-(4-phenylsulfanylphenyl)-butan-1,2-dione 2-oxime-o-benzoate, 1-(4-phenylsulfanylphenyl)-octane-1, 2-dione 2-oxime-o-benzoate, 1-(4-phenylsulfanylphenyl)-octan-1-oneoxime-o-acetate, 1-(4-phenylsulfanylphenyl)-butan-1-oneoxime-o-acetate, and the like, and combinations thereof.

Besides the above photopolymerization initiator, a carbazole-based compound, a diketone compound, a sulfonium borate-based compound, a diazo-based compound, and the like, and combinations thereof, may be used.

The photopolymerization initiator absorbs light and is excited and then transmits energy, and thus it may be used with a photo-sensitizer causing a chemical reaction.

The photosensitive resin composition may include the photopolymerization initiator in an amount of about 0.1 wt % to about 10 wt % based on the total amount (weight) of the photosensitive resin composition for a color filter. In some embodiments, the photosensitive resin composition may include the photopolymerization initiator in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of photopolymerization initiator can be in a range from about any of the foregoing amounts to about any other of the foregoing amounts.

When the photopolymerization initiator is included in an amount within the above range, it may bring about sufficient photopolymerization in the patterning process, while not deteriorating transmittance due to residual non-reacted initiator remnants.

The extent of cross-linking caused by the dye-polymer composite (A) can be determined or decided based on the composition ratio of the acrylic-based photopolymerizable monomer (B) and the photopolymerization initiator (C), and accordingly the extent of cross-linking may be controlled by adjusting the composition ratio of the acrylic-based photopolymerizable monomer (B) and the photopolymerization initiator (C).

(D) Solvent

The solvent is required to be compatible with the dye-polymer composite (A) and other component materials but does not have a reaction therewith Examples of the solvent may include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid esters such as methyl lactate, ethyl lactate, and the like; oxy alkyl acetate esters such as oxy methyl acetate, oxy ethyl acetate, oxy butyl acetate, and the like; alkoxy alkyl acetate esters such as methoxy methyl acetate, methoxy ethyl acetate, methoxy butyl acetate, ethoxy methyl acetate, ethoxy ethyl acetate, and the like; 3-oxy alkyl propionate esters such as 3-oxy methyl propionate, 3-oxy ethyl propionate, and the like; 3-alkoxy alkyl propionate esters such as 3-methoxy methyl propionate, 3-methoxy ethyl propionate, 3-ethoxy ethyl propionate, 3-ethoxy methyl propionate, and the like; 2-oxy alkyl propionate esters such as 2-oxy methyl propionate, 2-oxy ethyl propionate, 2-oxy propyl propionate, and the like; 2-alkoxy alkyl propionate esters such as 2-methoxy methyl propionate, 2-methoxy ethyl propionate, 2-ethoxy ethyl propionate, 2-ethoxy methyl propionate, and the like; 2-oxy-2-methyl propionate esters such as 2-oxy-2-methyl methyl propionate, 2-oxy-2-methyl ethyl propionate, and the like; 2-alkoxy-2-methyl alkyl propionates of monooxy monocarboxylic acid alkyl esters such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanote, and the like; ketone acid esters such as ethyl pyruvate, and the like; a solvent having a high boiling point such as N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, carbonate ethylene, carbonate propylene, phenyl cellosolve acetate, and the like, and combinations thereof.

In one embodiment, taking into account compatibility and reactivity, glycol ethers such as ethylene glycol monoethyl ether, and the like; ethylene glycol alkylether acetates such as ethyl cellosolve acetate, and the like; esters such as 2-hydroxy ethyl propionate, and the like; diethylene glycols such as diethylene glycol monomethyl ether, and the like; propylene glycol alkylether acetates such as propylene glycol methylether acetate, propylene glycol propylether acetate, and the like, and combinations thereof, may be used. Taking into account the solubility of a dye, cyclohexanone may be used in an amount of about 10 to about 80 parts by weight based on about 100 parts by weight of a solvent. These solvents may be used singularly or as a mixture of two or more.

The photosensitive resin composition may include the solvent in a balance amount, for example about 20 to about 90 wt %%, based on the total amount (weight) of the photosensitive resin composition. In some embodiments, the photosensitive resin composition may include the solvent in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts.

When the solvent is present in an amount within the above range, the photosensitive resin composition can have good coating property, and flatness at a thickness of greater than or equal to 1 μm may be maintained.

(E) Pigment or Dye

The photosensitive resin composition may further include a pigment, a dye, or a combination thereof in order to realize color characteristics along with the dye-polymer composite (A). In exemplary embodiments, a hybrid type including both of a pigment and a dye may improve the problem of deterioration of light-radiation sensitivity, pattern-breaking, pattern linearity, residue, and the like generated due to excessive use of a pigment.

The pigment may have a color such as red, green, blue, yellow, violet, and the like. Examples of the pigment may include without limitation condensed polycyclic pigments such as anthraquinone-based pigments, perylene-based pigments, and the like, phthalocyanine-based pigments, azo-based pigments, and the like. The pigments may be used singularly or in a combination of two or more. Two or more pigments may be combined for adjusting maximum absorption wavelength, cross point, crosstalk, and the like.

The pigment may be dispersed in a solvent to be prepared in form of pigment dispersion and be included in the photosensitive resin composition for a color filter.

In order to disperse the pigment in the pigment dispersion uniformly, a dispersing agent may be used as needed. For this purpose, a non-ionic, anionic, or cationic dispersing agent may be used. Examples of dispersing agents include without limitation polyalkylene glycol and esters thereof, polyoxyalkylenes, polyhydric alcohol ester alkylene oxide addition products, alcohol alkylene oxide addition products, sulfonic acid esters, sulfonate salts, carboxylic acid esters, carboxylate salts, alkylamidealkyleneoxide addition products, alkylamines, and the like. These dispersing agents may be used singularly or as a mixture of two or more.

Along with the dispersing agent, a carboxyl group-containing first acrylic-based resin may be added to the pigment dispersion to improve stability and improve pattern formation of pixels.

The pigment may have a primary particle diameter of about 10 nm to about 80 nm, for example about 10 nm to about 70 nm. When the primary particle diameter falls in the above particle diameter range, stability can be excellent in the pigment dispersion and pixel resolution property may not deteriorate.

Examples of the dye may include without limitation anthraquinone-based compounds, cyanine-based compounds, mesocyanine-based compounds, azaporphyrin-based compounds, phthalocyanine-based compounds, pyrrolopyrrole-based compounds, diazo-based compounds, carbonium-based compounds, acridine-based compounds, thiazole-based compounds, quinomine-based compounds, methine-based compounds, quinoline-based compounds, and the like, and combinations thereof.

When the dispersion including the pigment and dye is used, the pigment and dye may be used in an amount of about 1:9 to about 9:1.

In some embodiments, the combination of the pigment and the dye may include the pigment in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the pigment can be in a range from about any of the foregoing amounts to about any other of the foregoing amounts.

In some embodiments, the combination of the pigment and the dye may include the dye in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the dye can be in a range from about any of the foregoing amounts to about any other of the foregoing amounts.

When the pigment and the dye are used in a weight ratio within the above range, high luminance and contrast ratio and desirable color characteristics may be realized.

The photosensitive resin composition may include the pigment and/or dye may be included in an amount of about 0.1 wt % to about 40 wt % based on the total amount (weight) of the photosensitive resin composition for a color filter. In some embodiments, the photosensitive resin composition may include the pigment and/or dye in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the pigment and/or dye can be in a range from about any of the foregoing amounts to about any other of the foregoing amounts.

When the photosensitive resin composition includes the pigment and/or dye in an amount within the above range, coloring effects and development performance may be desirable.

(F) Additive(s)

The photosensitive resin composition for a color filter may further include the dispersing agent described above in order to disperse a component such as a pigment or a dye in a solvent (D), along with the (A) to (C) components.

Examples of the dispersing agent may include without limitation polyalkylene glycol and esters thereof, polyoxyalkylenes, polyhydric alcohol ester alkylene oxide addition products, alcohol alkylene oxide addition products, sulfonic acid esters, sulfonate salts, carboxylic acid esters, carboxylate salts, s alkylamidealkylene oxide addition products, alkylamines, and the like and combinations thereof. These may be used singularly or as a combination of two or more.

The photosensitive resin composition may include the dispersing agent in an amount of about 10 to about 20 parts by weight based on about 100 parts by weight of a pigment. In some embodiments, the photosensitive resin composition may include the dispersing agent in an amount of about 10, 11, 12, 13, 14, 15, 16, 17, 18, 19, or 20 parts by weight. Further, according to some embodiments of the present invention, the amount of the dispersing agent can be in a range from about any of the foregoing amounts to about any other of the foregoing amounts.

Also, the ink composition may further include a silicon-based and/or fluorine-based coating improving agent to improve coating property and foam removing property and/or it may further include an adherence (adhesion) improving agent to improve adherence to a substrate.

The photosensitive resin composition may include the coating improving agent and the adherence improving agent in an amount of about 0.01 wt % to about 1 wt % based on the total amount (weight) of the photosensitive resin composition.

In addition, the photosensitive resin composition for a color filter may further include one or more additives such as but not limited to epoxy compounds; malonic acid; 3-amino-1,2-propanediol; silane-based coupling agents with a vinyl group or a (meth)acryloxy group; leveling agents; silicon-based surfactants; fluorine-based surfactants; radical polymerization initiators, and the like, and combinations, which can help prevent staining or spotting during coating, prevent generation of a residue due to non-development and/or control leveling. The amounts and types of additives may be easily selected by the skilled artisan depending on a desired property.

Examples of the epoxy compound may include without limitation phenol novolac epoxy resins, tetra methyl non-phenyl epoxy resins, bisphenol A-type epoxy resins, alicyclic epoxy resins, ortho-cresol novolac resins, and the like, and combinations thereof. The photosensitive resin composition may include the epoxy compound in an amount ranging from about 0.01 wt % to about 5 wt % based the total amount (weight) of the photosensitive resin composition. In some embodiments, the photosensitive resin composition may include the epoxy in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, or 5 wt %. Further, according to some embodiments of the present invention, the amount of the epoxy can be in a range from about any of the foregoing amounts to about any other of the foregoing amounts.

When the epoxy compound is included in an amount within the above range, it may bring about excellent storage and process margin.

Examples of the silane-based coupling agent may include without limitation vinyl trimethoxysilane, vinyl tris(2-methoxyethoxysilane), 3-glycidoxypropyl trimethoxysilane, 2-(3, 4-epoxy cyclohexyl)ethyl trimethoxysilane, 3-chloropropyl methyldimethoxysilane, 3-chloropropyl trimethoxysilane, 3-methacryloxylpropyl trimethoxysilane, 3-mercaptopropyl trimethoxysilane, and the like, and combinations thereof.

The photosensitive resin composition may include the silane-based coupling agent in an amount ranging from about 0.01 wt % to about 2 wt % based on the total weight of the photosensitive resin composition for a color filter. In some embodiments, the photosensitive resin composition may include the silane-based coupling agent in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, or 2 wt %. Further, according to some embodiments of the present invention, the amount of the silane-based coupling agent can be in a range from about any of the foregoing amounts to about any other of the foregoing amounts.

When the silane-based coupling agent is included in an amount within the above range, it may bring about excellent adherence, storage stability, and coating properties.

Examples of the silicon-based surfactant may include without limitation surfactants including a siloxane bond, and the like. Examples of silicon-based surfactants may include without limitation DC3PA, SH7PA, DC11PA, SH21PA, SH28PA, 29SHPA, and SH30PA of TORAY SILICONE CO., LTD.; polyester-modified silicone oil, SH8400 of TORAY SILICONE CO., LTD; KP321, KP322, KP323, KP324, KP326, KP340, and GF of SHINETSU SILICONE CO., LTD.; TSF4445, TSF4446, TSF4452, and TSF4460 of TOSHIBA SILICONE CO., LTD.; and the like, and combinations thereof.

Examples of the fluorine-based surfactant may include without limitation surfactants having a fluorocarbon backbone, and the like. Examples of the fluorine-based surfactant may include without limitation FULORAD FC430, and FULORAD FC431 of SUMITOMO 3M CO., LTD.; MEGAFACE F142D, MEGAFACE F171, MEGAFACE F172, MEGAFACE F173, MEGAFACE F177, MEGAFACE F183, MEGAFACE F470, MEGAFACE F475, MEGAFACE R30 of DAINIPPON INK KAGAKU KOGYO CO., LTD.; EFTOP EF301, EFTOP EF303, EFTOP EF351, and EFTOP EF352 of TOCHEM RODUCTS, CO., LTD.; SURFLON S381, SURFLON S382, SURFLON SC101, and SURFLON SC105 of ASAHI GLASS CO., LTD.; E5844 of DIKIN Finechemical Laboratory; and the like, and combinations thereof.

The silicon-based surfactant and fluorine-based surfactant may be used singularly or as a mixture of two or more.

According to another embodiment of the present invention, a color filter manufactured using the photosensitive resin composition for a color filter is provided.

The color filter may be applicable for use with various electronic devices such as a liquid crystal display device, an organic light emitting diode, an image sensor, and the like.

The color filter may be provided by coating the photosensitive resin composition on a substrate followed by patterning. The patterning may be performed by exposing and developing, wherein the exposing may be prerformed by radiating with UV radiation, electron beam radiation, or X ray radiation having a wavelength of, for example about 190 nm to about 450 nm, and as another example about 200 nm to about 400 nm.

The following examples illustrate the present invention in more detail. However, it is understood that the present invention is not limited by these examples.

Synthesis Examples 1 to 4

Synthesis of Dye-Polymer Composite

A monomer (dye 1) represented by the following Chemical Formula 8, benzyl methacrylate, methacrylic acid, methylmethacrylate and N-benzylmaleimide are put into a flask with a condensing pipe and an agitater in the weight ratio of the following Table 1, and 2,2'-azobis(2,4-dimethylvaleronitrile), which is an initiator, is added in an amount of about 6 parts by weight based on 100 parts by weight of the monomers. Subsequently, about 300 parts by weight of propyleneglycol monomethyletheracetate (PGMEA, solvent) is added based on 100 parts by weight of the initiator and the monomer and began to be agitated in a nitrogen atmosphere. The reaction solution is heated to about 90° C. and agitated for about 10 hours so as to obtain a dye-polymer composite solution.

The dye-polymer composite solution obtained as above has a solid concentration of about 20 wt %, and a weight average molecular weight shown in Table 1. The weight average molecular weight is a polystyrene-converted average molecular weight measured using gel permeation chromatography (GPC).

[Chemical Formula 8]

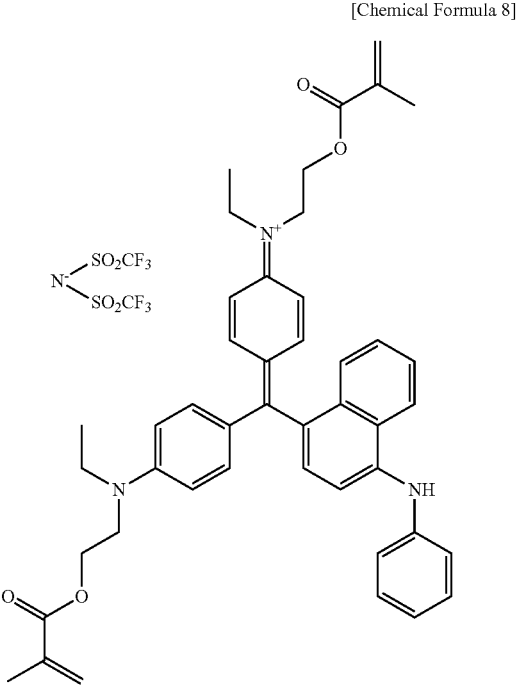

Comparative Synthesis Example 1

Synthesis of Copolymer

Copolymer solutions are obtained according to the same methods as Synthesis Examples 1 to 4, except that the monomer represented by the Chemical Formula 8 is not included. The solid concentration of the acrylic-based copolymer solution obtained in Comparative Synthesis Example 1 is about 20 wt %, and its weight average molecular weight is as shown in Table 1. The weight average molecular weight is a polystyrene-converted average molecular weight measured by using Gel Permeation Chromatography (GPC).

TABLE 1

| | Benzyl methacrylate | Methacrylic acid | Methyl methacrylate | N-benzyl maleimide | Dye 1 | Weight average molecular weight of dye-polymer composite or acrylic-based copolymer (Mw) |
|---|---|---|---|---|---|---|
| Synthesis Example 1 | 25 | 20 | 30 | 15 | 10 | 8000 |
| Synthesis Example 2 | 25 | 20 | 20 | 15 | 20 | 7600 |
| Synthesis Example 3 | 25 | 20 | 10 | 15 | 30 | 7500 |
| Synthesis Example 4 | 25 | 20 | 0 | 15 | 40 | 7500 |
| Comparative Synthesis Example 1 | 25 | 20 | 40 | 15 | — | 8200 |

Preparation of Photosensitive Resin Composition for a Color Filter

Examples 1 to 4

A photosensitive resin composition is prepared using the components shown in the following Table 2. First, a photopolymerization initiator is dissolved in a solvent and then agitated at room temperature for about 2 hours. Subsequently, the dye-polymer composites polymerized in Synthesis Examples 1 to 4 and an acrylic-based photopolymerizable monomer are added and agitated at room temperature for about 2 hours. A coloring agent is added and agitated at room temperature for about 1 hour so as to prepare a photosensitive resin composition for a color filter according to one embodiment of the present invention. The solution is filtrated three times to remove impurities.

TABLE 2

| | Composition | Amount [g] |
|---|---|---|
| (A) | dye-polymer composite (polymerized copolymer of Synthesis Examples 1 to 4) | 24.0 |
| (B) | acrylic-based photopolymerizable monomer dipentaerythritol hexaacrylate (DPHA) | 5.0 |
| (C) | photopolymerization initiator IGACURE OXE02 (Ciba Specialty Chemicals) | 0.5 |
| (D) | solvent | |
| | PGMEA | 24.0 |
| | ethylethoxy propionate | 11.4 |
| | dye dispersion | 35.0 |
| | B-009 (KYUNGIN, blue dye) | 5.0 |
| | acrylic-based binder resin | 10.0 |
| | PGMEA (solvent) | 20.0 |
| (F) | additive | |
| | F-475 (DIC, fluorine-based surfactant) | 0.1 |

Comparative Example 1

(A) Photosensitive compositions for a color filter are prepared according to the same methods as Examples 1 to 4, except that the acrylic-based copolymer obtained in Comparative Synthesis Example 1 is used.

Comparative Example 2

(A) Photosensitive compositions for a color filter are prepared according to the same methods as Examples 1 to 4, except that the acrylic-based copolymer obtained in Comparative Synthesis Example 1 and the components shown in the following Table 3 are used.

TABLE 3

| | Composition | Amount [g] |
|---|---|---|
| (A) | acrylic-based copolymer polymerized in Comparative Synthesis Example 1 | 24.0 |
| (B) | acrylic-based photopolymerizable monomer dipentaerythritol hexaacrylate (DPHA) | 5.0 |
| (C) | photopolymerization initiator IGACURE OXE02 (Ciba Specialty Chemicals) | 0.5 |
| (D) | pigment dispersion | 35.0 |
| | Victoria Blue B (Fluka) | 5.0 |
| | acryl-based binder resin | 10.0 |
| | PGMEA (solvent) | 20.0 |
| (E) | solvent | |
| | PGMEA | 24.0 |
| | ethylethoxy propionate | 11.4 |
| (F) | additive | |
| | F-475 (DIC, fluorine-based surfactant) | 0.1 |

Formation of Color Filter Pattern

A transparent round bare glass substrate, which is not coated, is coated with the photosensitive resin compositions of Examples 1 to 4 and Comparative Examples 1 and 2 to a thickness of about 3 μm using a spin-coater (K-Spin8 of KDNS Corporation). A plurality of color filter patterns are formed by soft-baking on a hot-plate at about 80° C. for about 150 seconds, exposing with an exposer (I10C of Nikon Corporation) at power of about 60 mJ, developing at a development temperature of about 25° C. for a development time of about 60 seconds, cleaning for about 60 seconds, and spin-drying for about 25 seconds in a potassium hydroxide aqueous solution of a concentration of about 1 wt %.

(Evaluation of Physical Properties)

Chemical Resistance

Chemical resistances of the color filter patterns formed using the photosensitive resin compositions prepared according to Examples 1 to 4 and Comparative Examples 1 and 2 against a stripping solution are evaluated by immersing the color filter patterns in the stripping solution (PRS-2000 of J.T.Baker Corporation) of about 70° C. for about 10 minutes.

The chemical resistance against the stripping solution is evaluated by a color change of the color filter patterns before and after immersion in the stripping solution and whether the color filter patterns are delaminated after immersion in the stripping solution.

The color change of the color filter patterns is measured using a spectrophotometer (MCPD3000 of Otsuka Electronics Corporation), and whether the color filter patterns are delaminated or not is evaluated with an optical microscope.

TABLE 4

|  | Color changes Bare glass | Peeling Bare glass |
| --- | --- | --- |
| Example 1 | Middle | Excellent |
| Example 2 | Middle | Excellent |
| Example 3 | Excellent | Excellent |
| Example 4 | Excellent | Excellent |
| Comparative Example 1 | Bad | Middle |
| Comparative Example 2 | Bad | Bad |

<Color Changes>

When the color change after the immersion in the stripping solution is weak or small: excellent When the color change after the immersion in the stripping solution is intermediate or middle: middle When the color change after the immersion in the stripping solution is strong or large: bad <Peeling>

When a photosensitive resin composition film is not delaminated: excellent

When a photosensitive resin composition film is slightly delaminated: photosensitive resin composition: middle When most of a photosensitive resin composition film is delaminated: bad Heat Resistance Color filter patterns formed of the photosensitive resin compositions prepared according to Examples 1 to 4 and Comparative Examples 1 and 2 are heat treated in an oven set to about 230° C. for about 30 minutes and the heat resistance thereof is evaluated.

The heat resistance is evaluated by detecting the color changes of the color filter patterns before and after the heat treatment, and the color change is measured using a spectrophotometer (MCPD3000 of Otsuka Electronics Corporation).

TABLE 5

|  | Heat resistance Bare glass |
| --- | --- |
| Example 1 | Middle |
| Example 2 | Middle |
| Example 3 | Excellent |
| Example 4 | Excellent |
| Comparative Example 1 | Middle |
| Comparative Example 2 | Bad |

<Heat Resistance>

When a color change is weak or small after the heat treatment is performed in an oven at about 230° C.: excellent When a color change is intermediate or middle after the heat treatment is performed in an oven at about 230° C.: insufficient When a color change is strong or significant after the heat treatment is performed in an oven at about 230° C.: bad Close Contacting Property According to the same method as the method used for forming the color filter pattern, a transparent round bare glass substrate, which is not coated, is coated with the photosensitive resin compositions of Examples 1 to 4 and Comparative Examples 1 and 2 to a thickness of about 3 μm, exposed and developed.

To evaluate the close contacting (adhesion) properties of the photosensitive resin compositions of Examples 1 to 4 and Comparative Examples 1 and 2 to a substrate, the width between the actually formed patterns based on the width between the patterns that are actually to be formed is measured. The width of the patterns are observed with a microscope and evaluated.

A pattern error rate is calculated by obtaining the difference between the width of the patterns desired to be formed and the width of patterns measured after actual development. As the measured error rate becomes greater, this means that more pattern is lost, and as the error rate is smaller, the adhesion of the photosensitive resin composition to the substrate is excellent so that the targeted width of pattern may be formed.

TABLE 6

|  | Close contacting property |
| --- | --- |
| Example 1 | Excellent |
| Example 2 | Excellent |
| Example 3 | Excellent |
| Example 4 | Excellent |
| Comparative Example 1 | Middle |
| Comparative Example 2 | Middle |

As shown in Tables 4 to 6, the coating layers formed of the photosensitive resin composition of Examples 1 to 4 according to one embodiment of the present invention are not delaminated and have excellent heat resistance, while having little color change to a stripping solution treatment. It may be seen from the results that the photosensitive resin composition according to an exemplary embodiment of the present invention can have excellent resistance against the stripping solution and heat.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for a color filter, comprising:

(A) a dye-polymer composite including a structural unit derived from the compound represented by the following Chemical Formula 4;

(B) an acrylic-based photopolymerizable monomer;

(C) a photopolymerization initiator; and
(D) a solvent:

[Chemical Formula 4]

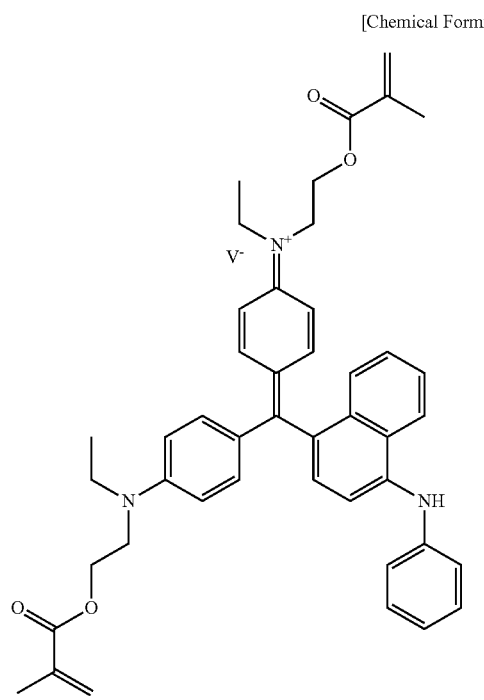

wherein, in Chemical Formula 4, V⁻ is a counter ion of N⁺.

2. The photosensitive resin composition for a color filter of claim 1, wherein the dye-polymer composite (A) includes the structural unit derived from the compound represented by Chemical Formula 4 in an amount of about 0.1 wt % to about 50 wt % based on the total weight of the dye-polymer composite (A).

3. The photosensitive resin composition for a color filter of claim 1, wherein the photosensitive resin composition for a color filter comprises
(A) about 0.5 wt % to about 40 wt % of the dye-polymer composite;
(B) about 0.5 wt % to about 20 wt % of the acrylic-based photopolymerizable monomer;
(C) about 0.1 wt % to about 10 wt % of the photopolymerization initiator; and
(D) balance of the solvent.

4. The photosensitive resin composition for a color filter of claim 1, wherein the dye-polymer composite (A) have a weight average molecular weight (Mw) of about 1,000 to about 500,000.

5. The photosensitive resin composition for a color filter of claim 1, wherein the dye-polymer composite (A) comprises at least one of structural units represented by the following Chemical Formulae 5 to 7 or a combination thereof:

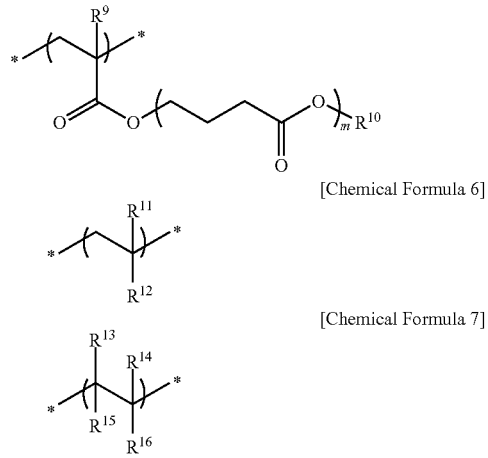

wherein, in Chemical Formulae 5 to 7,
$R^9$, $R^{10}$, $R^{11}$, $R^{13}$ and $R^{14}$ are the same or different and are each independently hydrogen, substituted or unsubstituted C1 to C30 alkyl, substituted or unsubstituted C6 to C30 aryl, substituted or unsubstituted C6 to C30 alkylaryl, or a combination thereof,
$R^{12}$ is substituted or unsubstituted C1 to C30 alkyl, substituted or unsubstituted C6 to C30 aryl, —CO—$R^{17}$—COOH wherein $R^{17}$ is substituted or unsubstituted C1 to C30 alkylene or substituted or unsubstituted C1 to C30 alkoxylene group, or a combination thereof,
$R^{15}$ is —COOH or —CONHR$^{18}$ wherein $R^{18}$ is substituted or unsubstituted C1 to C30 alkyl or substituted or unsubstituted C6 to C30 aryl,
$R^{16}$ is —COOH, or
$R^{15}$ and $R^{16}$ are fused to form a ring, and
m is an integer of 0 to 5.

6. The photosensitive resin composition for a color filter of claim 5, wherein the dye-polymer composite (A) includes the structural units represented by the above Chemical Formulae 5 to 7 in amounts of o, p and q mol, where o, p and q are about 0≤o≤80, 0≤p≤80 and 0≤q≤80, respectively.

7. The photosensitive resin composition for a color filter of claim 5, wherein the dye-polymer composite (A) includes structural units represented by Chemical Formulae 5 to 7 in an amount of about 0.1 wt % to about 50 wt % based on the total weight of the dye-polymer composite (A).

8. The photosensitive resin composition for a color filter of claim 1, further comprising a pigment, a dye, or combination thereof in an amount of about 0.1 wt % to about 40 wt % based on the total weight of the photosensitive resin composition.

9. A color filter manufactured using the photosensitive resin composition for a color filter according to claim 1.

* * * * *